United States Patent
Sakuyama et al.

[11] Patent Number: 6,135,344
[45] Date of Patent: Oct. 24, 2000

[54] REFLOW SOLDERING METHOD AND A REFLOW SOLDERING FURNACE

[75] Inventors: Seiki Sakuyama, Kobe; Taro Matsuoka, Chigasaki, both of Japan

[73] Assignees: Fujitsu Limited, Kanagawa; The Furukawa Electric Co., Ltd., Tokyo, both of Japan

[21] Appl. No.: 09/123,869

[22] Filed: Jul. 28, 1998

[30] Foreign Application Priority Data

Jul. 31, 1997  [JP]  Japan ..................... 9-206189

[51] Int. Cl.⁷ .............. B23K 31/02; B23K 1/00; B23K 5/00; D06E 75/24; F27B 14/00
[52] U.S. Cl. ............ 228/234.1; 219/255; 219/422; 228/42
[58] Field of Search ............ 228/42, 51, 234.1; 219/400, 388, 255, 422

[56] References Cited

U.S. PATENT DOCUMENTS

| | | | |
|---|---|---|---|
| 5,039,841 | 8/1991 | Kato et al. | 219/388 |
| 5,154,338 | 10/1992 | Okuno et al. | 228/42 |
| 5,347,103 | 9/1994 | LeMieux | 219/400 |
| 5,364,007 | 11/1994 | Jacobs et al. | 228/42 |
| 5,567,151 | 10/1996 | Mizoguchi et al. | 432/145 |
| 5,942,842 | 8/1999 | Fogle, Jr. | 313/313 |

FOREIGN PATENT DOCUMENTS

| | | |
|---|---|---|
| 6-045748 | 2/1994 | Japan . |
| 6-224551 | 8/1994 | Japan . |
| 198525 | 1/1993 | Taiwan . |

*Primary Examiner*—Patrick Ryan
*Assistant Examiner*—C. Newsome
*Attorney, Agent, or Firm*—Frishauf, Holtz, Goodman, Langer & Chick, P.C.

[57] ABSTRACT

A reflow soldering furnace in which a printed board and a plurality of electronic parts mounted thereon are subjected to reflow soldering. The furnace comprises a reflow soldering furnace body including a plurality of heating zones defined by furnace walls, a hot-gas applier, and a radiant-heat applier. The hot-gas applier includes a heat source and a fan for blowing a hot gas of a temperature lower than a target temperature for each zone against a printed board. The radiant-heat applier includes a heater for applying radiant heat of a temperature higher than the target temperature to the printed board. The printed board and electronic parts thereon are heated to the target temperature, the melting point of solder, by means of the radiant heat from the heater. Among these electronic parts, small-sized ones with a relatively small heat capacity are restrained from overheating by the low-temperature hot gas from the hot-gas applier.

5 Claims, 4 Drawing Sheets

REFLOW SOLDERING METHOD AND A REFLOW SOLDERING FURNACE

BACKGROUND OF THE INVENTION

The present invention relates to a reflow soldering method and a reflow soldering furnace for heating a printed board on which solder paste is printed and electronic parts, such as surface-mounted devices (hereinafter referred to as "SMDs"), mounted on the printed board and soldering the electronic parts to the board.

Reflow soldering is known as a mounting technique for electrically connecting and mechanically fixing electronic parts, such as SMDs, to a printed board. In a reflow soldering process, various SMDs are mounted on a printed board, on which solder paste is printed in advance, in a manner such that their leads are in alignment with pads of a thin film circuit on the printed board. Thereafter, the printed board is introduced into a reflow soldering furnace (hereinafter sometimes referred to as "reflow furnace") and heated, whereupon the solder paste is melted so that the SMDs are soldered to the printed board.

The reflow soldering furnace for carrying out this reflow soldering process comprises a furnace body that is provided with a conveyor for conveying the printed board. In the reflow soldering furnace body, preheating zones and a main heating zone (or reflow zone), which are defined by furnace walls, arranged in the conveying direction of the conveyor. The printed board and the SMDs thereon, as to-be-heated objects, are heated by means of heating means that are provided in the zones, individually. The heating means may be conventional heating devices, such as a hot-gas applier for blowing a hot gas against each to-be-heated object and a radiant-heat applier using a far infrared heater and the like.

In the preheating zones of the reflow soldering furnace, each to-be-heated object is heated to a temperature of 120 to 170° C. to ease thermal shocks on the SMDs. In the main heating zone that follows the preheating zones, the to-be-heated object is heated to a temperature of 210 to 230° C., which is higher than the melting point (180° C.) of solder by 30 to 50° C., whereby the solder is melted. The to-be-heated object delivered from the main heating zone is subjected to natural or forced cooling so that the solder solidifies, whereupon the reflow soldering is completed.

With the advance of diversification of electronic parts such as SMDs, there is an increasing demand for printed boards that are mounted with a large number of electronic parts of various types each. Accordingly, a large number of electronic parts with different sizes (or different heat capacities) are expected to be reflow-soldered to each printed board efficiently and securely. On the other hand, there are printed boards of various sizes. In some cases, electronic parts may be mounted on large-sized printed boards with large heat capacities. In consideration of these circumstances, electronic parts are expected to be reflow-soldered to various printed boards with high efficiency and reliability.

In the conventional reflow soldering process, the entire to-be-heated object is heated in the furnace in which the temperature is raised to a level higher than the melting point of solder by means of a hot gas or a combination of a hot gas and an infrared heater. If the heater output is not high enough for large-sized electronic parts with large heat capacities, however, the temperatures of the parts and their surroundings cannot be raised with ease. In some cases, therefore, joints (solder joints) between the printed board and leads of the electronic parts may not be able to be heated to a predetermined temperature, resulting in defective soldering.

The aforementioned underheating can be compensated with an increase of the hot gas temperature or the heater output. If this is done, however, those portions of the printed board which carry no electronic parts thereon or small-sized electronic parts with small heat capacities will overheat. In such a case, the thin film circuit on the printed board may be disconnected or cracked, and the small-sized parts may possibly be damaged or lowered in properties.

BRIEF SUMMARY OF THE INVENTION

Accordingly, the object of the present invention is to provide a reflow soldering method and a reflow soldering furnace, capable of carrying out appropriate reflow soldering without entailing under- or overheating despite the differences in heat capacity between electronic parts mounted on a printed board.

In order to achieve the above object, according to the invention, there is provided a reflow soldering method for heating a to-be-heated object to a target temperature in one or more heating zones, comprising blowing a hot gas of a temperature lower than the target temperature against the to-be-heated object by using hot-gas applying means in the heating zones and applying radiant heat of a temperature higher than the target temperature to the to-be-heated object, thereby heating the to-be-heated object to the target temperature.

According to this reflow soldering method, electronic parts with a small heat capacity are cooled by means of the hot gas of the temperature lower than the target temperature for the heating zones, while electronic parts with a large heat capacity are heated to the target temperature by means of the radiant heat. By doing this, a plurality of electronic parts with different heat capacities can be soldered to a printed board when the temperature differences between the electronic parts are reduced.

In order to achieve the above object, according to the present invention, there is provided a reflow soldering method for preheating a to-be-heated object to a temperature lower than the melting point of solder in one or more preheating zones and then heating the to-be-heated object to the melting point of the solder in a main heating zone, comprising blowing a hot gas of a temperature lower than the target temperature for the preheating zones against the to-be-heated object by using hot-gas applying means in the preheating zones and applying radiant heat of a temperature higher than the target temperature to the to-be-heated object, thereby heating the to-be-heated object to the target temperature.

According to this reflow soldering method, electronic parts with a small heat capacity are cooled by means of the hot gas of the temperature lower than the target temperature for the preheating zones at least in the preheating zones, while electronic parts with a large heat capacity are heated to the target temperature by means of the radiant heat. By doing this, a plurality of electronic parts with different heat capacities can be soldered to a printed board in the main heating zone when the temperature differences between the electronic parts are reduced.

In the reflow soldering methods according to the invention described above, the heating of the to-be-heated object by means of the radiant heat includes joint use of far infrared rays with a wavelength of 2.5 to 5,000 μm and infrared rays including near infrared rays with a wavelength of 0.75 to 2.5 μm. In some cases, the joint use of the infrared rays and the far infrared rays may be an effective measure for further reduction of the temperature differences between the parts on the printed board. In general, the printed board easily absorbs infrared rays with a wavelength of 2.5 μm or more, while the electronic parts on the printed board easily absorb infrared rays with a wavelength of less than 2.5 μm. Thus, the printed board and the electronic parts thereon have their respective infrared absorption spectra. In consequence, the temperature differences between the printed board and the electronic parts can be further reduced by jointly using an infrared heater and a far infrared heater and controlling the ratio between the respective outputs of these heaters.

Preferably, the radiation spectra of the infrared heater should exhibit a maximum value within a wavelength region of less than 2.5 μm, and further preferably, within a region from 1 to 2.5 μm. On the other hand, the radiation spectra of the far infrared heater should preferably exhibit a maximum value within a wavelength region of 2.5 μm or more, and further preferably, within a region from 5 to 8 μm.

According to the invention, the target temperature is a temperature at which thermal equilibrium is established for the preheating zones by the heating by means of the radiant heat and the cooling by means of the hot gas. It is necessary, therefore, only that the temperature of the hot gas in the preheating zones be set to be lower than the temperature (target temperature) at which the thermal equilibrium is established. Good results can be obtained, in particular, when the hot gas temperature is adjusted to a value lower than the target temperature by about 20 to 60° C. The target temperature for the main heating zone is the temperature at which the solder melts. Accordingly, the temperature of the hot gas in the main heating zone is set to be lower than the melting point of the solder. The hot gas temperature described herein is a temperature reached immediately before the hot gas is contact with the printed board.

According to the reflow soldering method of the invention in which the heating by means of the radiant heat and the cooling by means of the hot gas are combined together, dispersions in the temperature of the to-be-heated object can be reduced to a level lower than that of the conventional method if one or more of the heating zones are used. The heating method according to the invention may be used for some or all of the preheating zones or a part or the whole of the main heating zone. Alternatively, the heating method of the invention may be used for both the preheating and main heating zones. The object of the present invention can be best achieved by using the heating method of the invention at least for the preheating zones.

Figure 5:
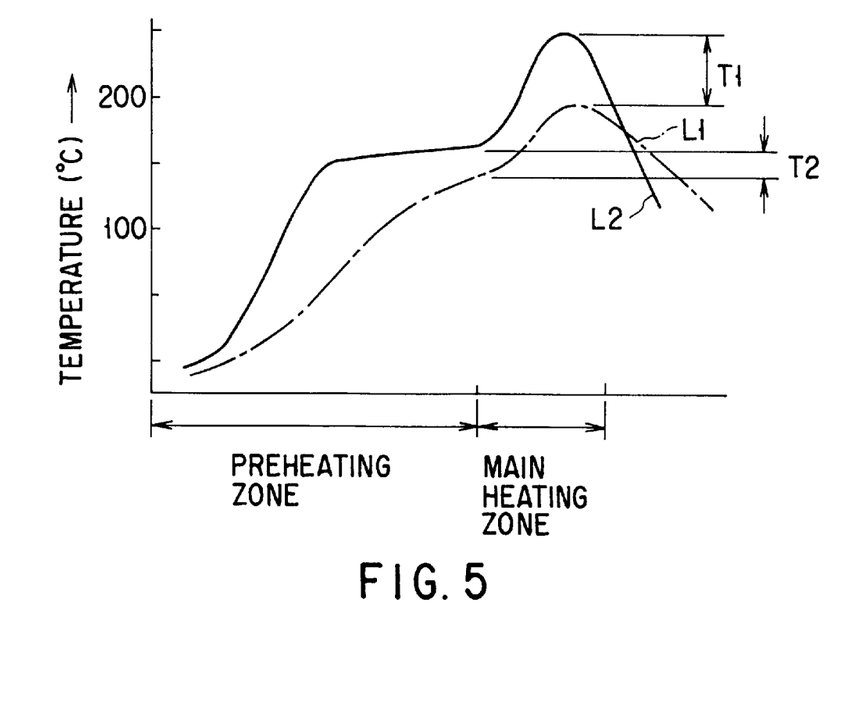
FIG. 5 is a diagram showing temperature changes in portions with large and small heat capacities in a general reflow soldering process.

Curves L1 and L2 of FIG. 5 show temperature changes in parts with large and small heat capacities observed when the to-be-heated object is heated by stages in the preheating zones and the main heating zone in a general reflow soldering process. In order to solder the parts on the printed board uniformly, a temperature difference T1 shown in FIG. 5, that is, the difference between the respective peak temperatures of the parts with large and small heat capacities, must be reduced. To attain this, it is advisable previously to reduce a temperature difference T2 for the preheating zones, that is, the temperature difference obtained before the peak temperatures are reached, by using the heating method of the invention for the preheating zones.

In order to achieve the above object, a reflow soldering furnace according to the invention comprises a reflow soldering furnace body including one or more heating zones defined by furnace walls, a hot-gas applier for blowing a hot gas of a temperature lower than a target temperature for the heating zones against a to-be-heated object in the heating zones, and a radiant-heat applier for applying radiant heat of a temperature higher than the target temperature to the to-be-heated object. This reflow soldering furnace has been developed in consideration of the fact that the speed of temperature rise depends on the heat capacity of the to-be-heated object. More specifically, this arrangement is based on the fact that the temperature of an electronic part with a large heat capacity cannot increase with ease, while the temperature of a small-sized electronic part or a printed board with a small heat capacity can increase easily. Another factor is that the larger the heat capacity, the less easily the temperature lowers in a cooling process, and vice versa.

In the reflow soldering furnace of the invention, if the hot gas of the temperature lower than the target temperature is applied to the to-be-heated object, then the object will be cooled. If the radiant heat of the temperature higher than the target temperature is applied to the to-be-heated object, in contrast with this, then the object will be heated to a suitable temperature for soldering. Thus, the temperature of electronic parts with a large heat capacity can be increased to the suitable level for soldering by means of the radiant heat, while small-capacity parts can be cooled and prevented from overheating by means of the low-temperature hot gas. By controlling the balance between the cooling and heating, various electronic parts with difference heat capacities can be heated uniformly to soldering temperature.

In order to achieve the above object, a reflow soldering furnace according to the invention comprises a reflow soldering furnace body including one or more preheating zones and a main heating zone defined by furnace walls, a hot-gas applier for blowing a hot gas of a temperature lower than a target temperature for the preheating zones against a to-be-heated object at least in the preheating zones, and a radiant-heat applier for applying radiant heat of a temperature higher than the target temperature to the to-be-heated object in the preheating zones.

According to the invention, moreover, the radiant-heat applier includes heaters of two types, an infrared heater for generating infrared rays and a far infrared heater for generating far infrared rays. The joint use of these heaters of two types is an effective measure for the reduction of the temperature differences between the individual parts on the printed board.

The following first, second, and third layouts are provided for the arrangement of the radiant-heat applier and the hot-gas applier for carrying out the heating method according to the present invention. These layouts can lessen the temperature dispersions of the individual parts of the printed board, as compared with the prior art. The first and second layouts, in particular, can produce desirable results for the achievement of the object of the invention.

According to the first layout, the radiant-heat applier and the hot-gas applier are arranged so that the application of the radiant heat and the blowing of the hot gas from above the printed board can be carried out simultaneously. The second layout is an example of an individual arrangement. According to this layout, the radiant-heat applier and the hot-gas applier are arranged separately from each other so that the hot gas is blown against the printed board after the radiant heat is applied from above the printed board. The third layout is another example of the individual arrangement. According to this layout, the hot-gas applier and the radiant-heat applier are arranged separately from each other so that the radiant heat is applied after the hot gas is blown from above the printed board.

In a reflow soldering furnace according to an aspect of the invention, an infrared heater for radiating infrared rays is used in the radiant-heat applier. It is advisable, in particular, to use an infrared heater that radiates near infrared rays with a peak wavelength of 1 to 2 μm, in particular. In this case, a heater (hereinafter referred to as "halogen lamp heater") using a halogen lamp can be used as the infrared heater. Since the packages of the electronic parts mounted on the printed board easily absorb short wavelengths of 1 to 2 μm, in particular, the aforesaid heater can be suitably used to increase the speed of temperature rise of large-sized electronic parts whose temperature cannot be easily increased. However, the present invention is not limited to the arrangement in which the halogen lamp heater is used as the radiant-heat applier. For example, a far infrared heater or a combination of a far infrared heater and a halogen heater (infrared heater) may be used as the radiant-heat applier. In the latter case, the temperature differences between the individual parts can be reduced by controlling the respective outputs of the two heaters according to the types of the electronic parts and the printed board.

In the case where the hot-gas applier and the radiant-heat applier are used in combination in a reflow soldering furnace that carries but reflow soldering in an inert gas, the temperature of the hot gas that flows through a hot-gas circulation path may possibly become too high under the influence of the radiant heat in the furnace or the like. Preferably, the reflow soldering furnace of this type should further comprises hot-gas circulating means for guiding the circulating hot gas to the outside of the furnace and a heat exchanger for cooling the hot gas, guided by the hot-gas circulating means, by means of a heat transfer medium such as the open air. This heat exchanger serves to restrain the temperature of the hot gas in the reflow soldering furnace from being raised by the radiant heat or the like.

According to the invention, the hot-gas circulating means includes a by-pass duct diverging from the reflow soldering furnace body and provided with a radiating wall for use as the heat exchanger. The hot gas that passes through the by-pass duct is cooled as it is subjected to heat exchange with the heat transfer medium, such as the open air, outside the furnace through the radiating wall of the duct. Thus, the heat exchanger restrains the temperature of the hot gas in the reflow soldering furnace from being raised by the radiant heat or the like.

According to the invention, moreover, the heat exchanger may be provided with heat dissipation accelerating means, such as an air-cooling fan, water jacket, or radiating fin. This accelerating means serves to accelerate the heat exchange between the gas (hot gas) in the furnace and the heat transfer medium outside the furnace, thereby restraining the rise of the hot gas temperature more effectively.

According to the present invention described above, under- or overheating of the to-be-heated objects can be restrained to ensure appropriate reflow soldering despite the differences in heat capacity between the printed board and the electronic parts mounted thereon.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
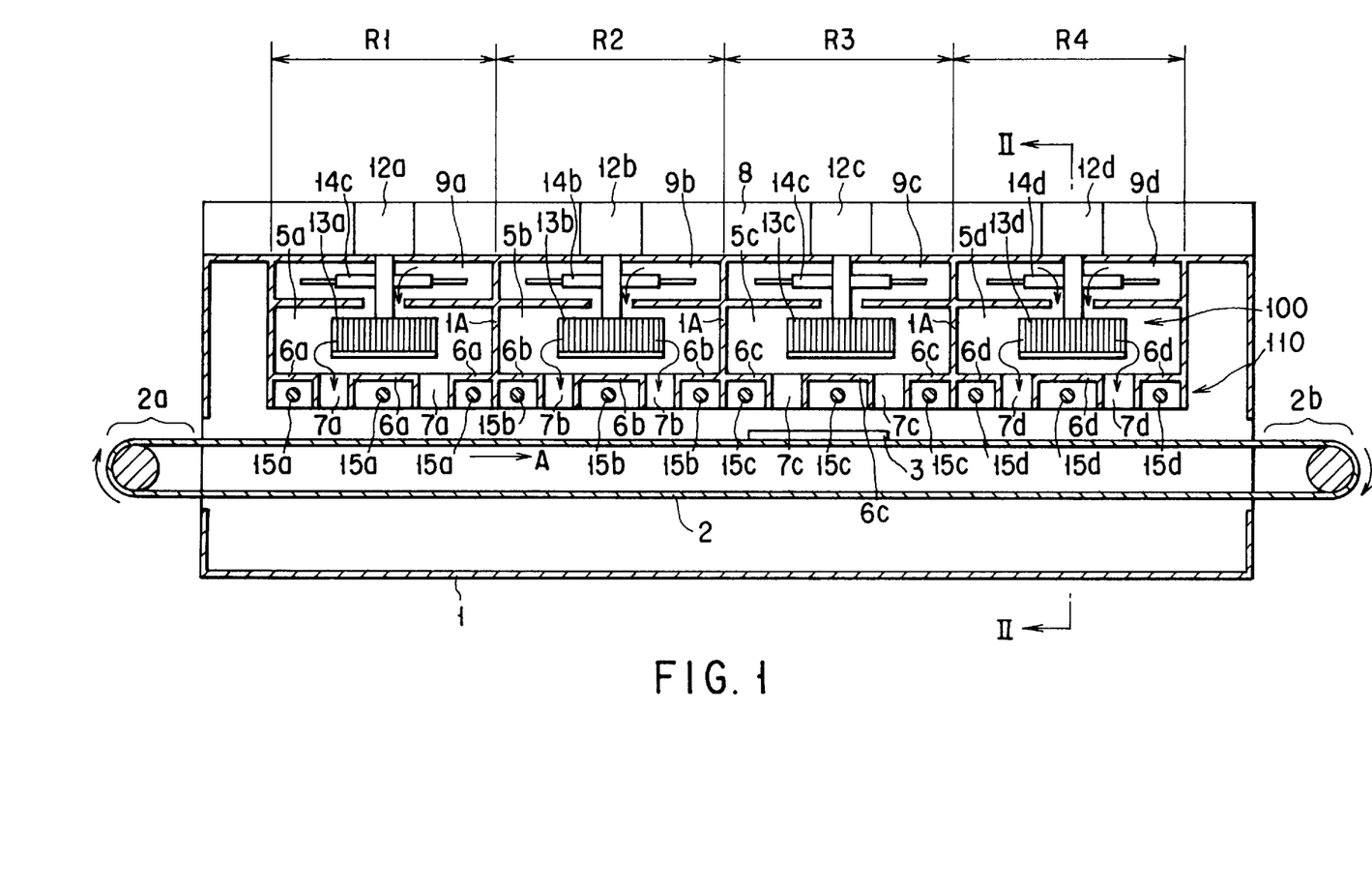
FIG. 1 is a sectional view schematically showing an outline of a reflow soldering furnace according to a first embodiment of the present invention for carrying out a reflow soldering method of the invention.
Figure 2:
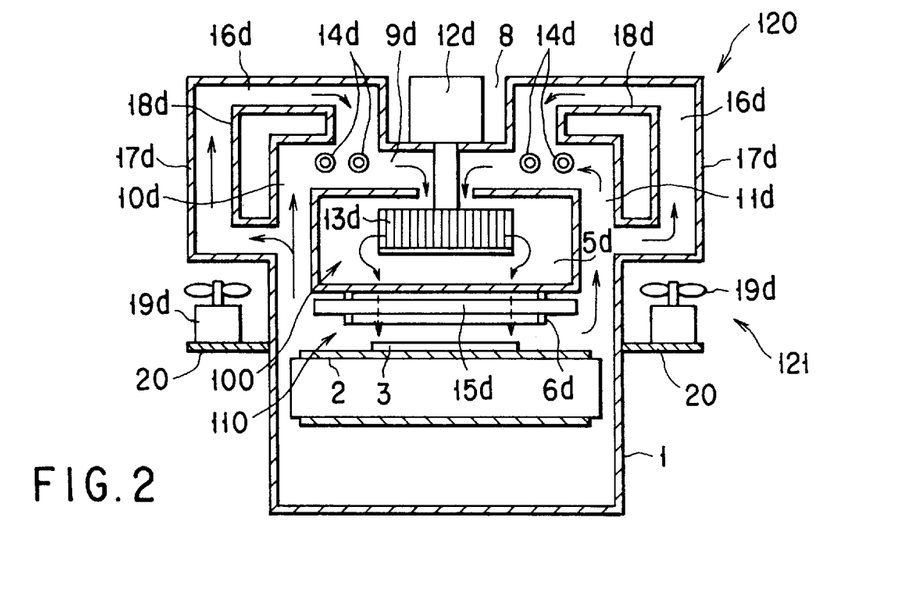
FIG. 2 is a sectional view of a main heating zone of the reflow soldering furnace taken along line II—II of FIG. 1.

Referring now to FIGS. 1 and 2, a first embodiment of the present invention will be described.

A reflow soldering furnace according to the first embodiment shown in FIG. 1 is a so-called inert-atmosphere furnace in which reflow soldering is carried out in an inert gas, for example. This reflow soldering furnace comprises a horizontally elongated furnace body 1 and a conveyor 2 that penetrates the body 1 in the longitudinal direction thereof. One end portion 2a and the other end portion 2b of the conveyor 2, which individually project from the furnace body 1, are used as a loading section and an unloading section, respectively, for to-be-heated objects (printed boards 3 or the like). The conveyor 2 is formed of a gas-permeable member such as a network or lattice structure. In FIG. 1, arrow A indicates the conveying direction of the conveyor 2 for the to-be-heated objects.

In the reflow soldering furnace body 1, furnace walls 1A define first to fourth heating zones R1 to R4, which are arranged in the conveying direction of the conveyor 2. All these zones R1 to R4 are kept in an inert gas atmosphere. The first to third heating zones R1 to R3 serve as preheating zones and the fourth heating zone R4 as a main heating zone (or reflow zone).

The zones R1 to R4, which are constructed in the same manner as one another, are provided with heating means, individually. Since these heating means are also constructed in like manner, only the fourth heating zone 4 and the heating means attached thereto will be described as representatives below. In FIG. 1, components in the zones R1 to R4 are discriminated from one another by suffixes a, b, c and d that are attached to reference numerals for them. The suffix a represents the components in the first heating zone R1; b, the components in the second heating zone R2; and c, the components in the third heating zone R3. The suffix d is attached to the numerals for the components in the fourth heating zone R4 to be described below.

In the fourth heating zone R4, a blast chamber 5d is defined over the conveyor 2. Under the chamber 5d, radiant-heat source mounting portions 6d are arranged in the longitudinal direction of the furnace body 1. Ventilation passages 7d are formed between the blast chamber 5d and the mounting portions 6d, individually. The mounting portions 6d face open to the conveyor 2. The inner surface of each mounting portion 6d is formed having a reflective surface that reflects radiant heat. A recess 8 is formed in the center of the upper end portion of the furnace body 1 with respect to the transverse direction thereof. The recess 8 extends covering the overall length of the body 1. A heater holding portion 9d is defined between the base wall of the recess 8 and the ceiling wall of the blast chamber 5d. The holding portion 9d communicates with the chamber 5d by means of a hole that opens in the ceiling wall.

As shown in FIG. 2, ventilation passages 10d and 11d are formed individually between the opposite side walls of the blast chamber 5d and their corresponding opposite side walls of the reflow soldering furnace body 1. The heater holding portion 9d and the respective lower parts of the ventilation passages 7d communicate with one another by means of the passages 10d and 11d. Thus, the blast chamber 5d, ventilation passages 7d, heater holding portion 9d, and ventilation passages 10d and 11d, which communicate with one another, constitute a hot-gas circulation path.

The heating means of the fourth heating zone R4 is a combination of a hot-gas applier 100 and a radiant-heat applier 110. The hot-gas applier 100 includes an electric motor 12d set in the recess 8, a fan 13d connected to the output shaft of the motor 12d and set in the blast chamber 5d, and heat sources 14d for hot-gas heating, such as electric heaters in the heater holding portion 9d. The fan 13d has its suction surface directed to the ceiling wall of the blast chamber 5d. A sirocco fan is an example of the fan 13d. Air is discharged through the peripheral surface of the fan 13d.

The hot-gas applier 100 blows a hot gas of a temperature lower than a target heating temperature for the printed boards 3 against each board 3, which is conveyed to the position under the passages 7d, through the ventilation passages 7d. This hot-gas heating alone cannot raise the temperature of the printed board 3 to a level at which solder melts. The temperature of the heat sources 14d for hot-gas heating is controlled by means of a temperature regulator (not shown).

The radiant-heat applier 110 is mounted on the radiant-heat source mounting portions 6d. The applier 110 radiates heat rays toward the conveyor 2 thereunder, thereby applying radiant heat of a temperature higher than the aforesaid target temperature to the printed board 3 conveyed thereto and various SMDs or other parts mounted on the board 3. The radiant heat generated by the radiant-heat applier 110 can heat parts with a relatively large heat capacity to a temperature at which solder melts.

An infrared heater for radiating short-wavelength infrared rays is used as the radiant-heat applier 110 that is mounted on the radiant-heat source mounting portions 6d. Preferably, the applier 110 should be formed of an infrared heater capable of radiating near infrared rays with a peak wavelength of 1 to 2 $\mu$m that can be easily absorbed by a large-sized SMD package whose temperature cannot be easily increased, in particular. A heater 15d (hereinafter referred to as "halogen lamp heater") using a tungsten halogen lamp that has a transparent bulb is a preferred example of the infrared heater. Input voltage for the halogen lamp heater 15d is controlled by means of a voltage controller of a control circuit (not shown) so that the heater can radiate near infrared rays of wavelength of 1 to 2 $\mu$m in the main.

As shown in FIG. 2, a by-pass duct 16d that constitutes a part of a hot-gas circulator 120 is provided on each side of the upper part of the fourth heating zone R4. The internal space of each duct 16d serves as a by-pass passage. One end of each duct 16d communicates with the middle portion of the ventilation passage 10d or 11d, and the other end thereof communicates with the heater holding portion 9d from above. The by-pass ducts 16d are formed of a metal material with a high heat transfer rate, such as an aluminum alloy. The outer wall portion of each duct 16d forms a radiating wall 17d that functions as a heat exchanger 121. The radiating wall 17d is exposed to the outside of the reflow soldering furnace body 1. Each of partition walls 18d shown in FIG. 2 constitutes a part of its corresponding by-pass duct 16d.

Each heat exchanger 121 includes a blower 19d for forced air-cooling that serves as heat dissipation accelerating means, as well as the radiating wall 17d. As shown in FIG. 2, each blower 19d is mounted on each corresponding one of support pieces 20, which protrude individually from the opposite side walls of the reflow soldering furnace body 1. The blowers 19d have a function to blow cooling air against the respective radiating walls 17d of their corresponding by-pass ducts 16d. Each blower 19d as the heat dissipation accelerating means for each heat exchanger 121 may be replaced with a radiating fin that protrudes from the outer surface of each radiating wall 17d or a water jacket that extends along each wall 17d and has cooling water therein. The blowers 19d may be used in combination with these alternatives.

In the reflow soldering furnace constructed in this manner, the loading section 2a of the conveyor 2 is supplied with the printed boards 3 on which the electronic parts, such as various SMDs, are mounted in position. As each printed board 3 is transported in the direction of arrow A in FIG. 1 by the conveyor 2, it passes through the first to third preheating zones R1 to R3. In the first to third preheating zones R1 to R3, the hot gas from the hot-gas applier 100 is blown against the to-be-heated object (printed board 3 and electronic parts thereon). At the same time, the to-be-heated object is preheated to a temperature of 120 to 170° C. as it is subjected to radiant heat from heaters 15a to 15c of the radiant-heat applier 110. In the main heating zone R4, moreover, the object is heated to a temperature of 210 to 230° C. as it is subjected to both the hot gas and radiant heat, as in the preheating zones R1 to R3. The heating of the object to the target temperature in the main heating zone R4 melts solder paste previously printed on the printed board 3.

In the reflow soldering in this reflow soldering furnace, the hot-gas applier 100, which constitutes a part of the heating means, applies the hot gas of a temperature lower than the target temperature to the to-be-heated object. Since this low-temperature gas cools the object, the temperatures of small-sized parts that are easily heated can be prevented from becoming too high. At the same time, the radiant-heat applier 110 applies radiant heat of a temperature higher than the target temperature to the to-be-heated object, so that the printed board 3 and large-sized parts, which cannot be heated with ease, can be heated to the target temperature.

By controlling the balance between the cooling by means of the hot-gas applier 100 and the heating by means of the radiant-heat applier 110, the temperature of SMDs with a large heat capacity can be increased to soldering temperature, while SMDs with a small heat capacity can be prevented from overheating. In this manner, the entire printed board 3 that is mounted with the various SMDs with different heat capacities can be heated substantially uniformly to suitable temperatures for soldering. Thus, the various SMDs can be mounted on the printed board 3 by reflow soldering without any problems.

The following experiments were conducted using the reflow soldering furnace according to the embodiment described above. Tables 1, 2, 3 and 4 show the results of these experiments. In Tables 1 to 4, R1 to R3 designate the first to third preheating zones, and R4 designates the main heating zone. A sample for the printed board 3 used in each experiment is formed of an epoxy resin reinforced by glass fiber fabric, measuring 250 mm in length, 250 mm in width, and 1.3 mm in thickness. The sample board 3 can be mounted with five SMDs of the QFP (quad-flat package) type each having 204 pins, four QFP-type SMDs with 64 pins, 10 SMDs of the SOP (small-outline package) with 28 pins, 40 SNDs of the chip component type, and 5 SNDs of the metal sealed-package type.

In each experiment, the respective temperatures of the hot-gas applier 100 and the radiant-heat applier 110 in the preheating zones R1 to R3 were controlled so that the saturated temperature in the zones R1 to R3 was 160° C. In other words, temperatures in the preheating zones R1 to R3 were controlled so that temperature of those zones was 160° C. when the conveying speed was extremely lowered. Likewise, in each experiment, the temperatures of the appliers 100 and 110 in the main heating zone R4 were controlled so that the maximum temperature of those regions of the printed board which were not mounted with any electronic parts (or distant enough from the electronic parts) was 220° C. when the conveying speed was 1 m/min. Temperature dispersions in each experiment were evaluated on the basis of the temperature difference T1 between the peak temperatures shown in FIG. 5.

TABLE 1

|  | R1 | R2 | R3 | R4 | CONVEYING SPEED |
|---|---|---|---|---|---|
| TEMPERATURE OF HOT GAS (° C.) | 130 | 130 | 130 | 170 | 1.0m/min |
| SPEED OF GAS FLOW (m/min) | 2 | 2 | 2 | 2 |  |
| OUTPUT OF 200V HALOGEN LAMP HEATER (KW) | 0.6 | 0.3 | 0.3 | 0.3 |  |

TEMPERATURE DIFFERENCE $T_1$: 9° C.
(PRINTED BOARD: 220° C., ELECTRONIC PARTS: 211° C.)
TEMPERATURE OF LEAD PORTION OF ELECTRONIC PARTS: 215° C.

TABLE 2

|  | R1 | R2 | R3 | R4 | CONVEYING SPEED |
|---|---|---|---|---|---|
| TEMPERATURE OF HOT GAS (° C.) | 130 | 130 | 130 | * | 1.0m/min |
| SPEED OF GAS FLOW (m/min) | 2 | 2 | 2 | 2 |  |
| OUTPUT OF 200V HALOGEN LAMP HEATER (KW) | 0.6 | 0.3 | 0.3 | 0.4 |  |

TEMPERATURE DIFFERENCE $T_1$: 13° C.
(PRINTED BOARD: 220° C., ELECTRONIC PARTS: 207° C.)
TEMPERATURE OF LEAD PORTION OF ELECTRONIC PARTS: 213° C.

*: HOT GAS NOT USED

TABLE 3

|  | R1 | R2 | R3 | R4 | CONVEYING SPEED |
|---|---|---|---|---|---|
| TEMPERATURE OF HOT GAS (° C.) | * | * | * | 170 | 1.0m/min |
| SPEED OF GAS FLOW (m/min) | 2 | 2 | 2 | 2 |  |
| OUTPUT OF 200V HALOGEN LAMP HEATER (KW) | 0.5 | 0.2 | 0.2 | 0.6 |  |

TEMPERATURE DIFFERENCE $T_1$: 15° C.
(PRINTED BOARD: 220° C., ELECTRONIC PARTS: 205° C.)
TEMPERATURE OF LEAD PORTION OF ELECTRONIC PARTS: 210° C.

*: HOT GAS NOT USED

TABLE 4

|  | R1 | R2 | R3 | R4 | CONVEYING SPEED |
|---|---|---|---|---|---|
| TEMPERATURE OF HOT GAS (° C.) | * | * | * | * | 1.0m/min |
| SPEED OF GAS FLOW (m/min) | 2 | 2 | 2 | 2 |  |
| OUTPUT OF 200V HALOGEN LAMP HEATER (KW) | 0.5 | 0.2 | 0.2 | 0.4 |  |

TEMPERATURE DIFFERENCE $T_1$: 25° C.
(PRINTED BOARD: 220° C., ELECTRONIC PARTS: 195° C.)
TEMPERATURE OF LEAD PORTION OF ELECTRONIC PARTS: 202° C.

*: HOT GAS NOT USED

Based on these experimental results (Tables 1 to 4), the effects of the reflow soldering furnace according to the present embodiment of the invention were verified. It was found that the invention can be effectively applied to at least the preheating zones of the furnace, in particular.

Since the reflow soldering furnace is provided with the by-pass ducts 16d, some or all of the hot gas to be circulated in the furnace body 1 can be returned to the hot-gas circulation path after it is introduced into the ducts 16d. In FIG. 2, the arrows indicate flows of the hot gas. The hot gas, circulated in this manner, is cooled by heat exchange with a heat transfer medium (e.g., open air) outside the furnace through the radiating walls 17d of the ducts 16d as it passes through the ducts 16d. Further, air is blown against the radiating walls 17d for heat exchange by means of the blowers 19d, whereby the walls 17d are subjected to forced cooling. Thus, the heat exchange between the furnace gas (hot gas) in the furnace body 1 and the heat transfer medium outside the furnace can be accelerated to restrain the rise of the hot gas temperature effectively.

In a conventional reflow soldering furnace (furnace for reflow soldering in an inert gas), a circulating hot gas (inert gas) tends to increase its temperature gradually as it is subjected to radiant heat or the like. In the reflow soldering furnace according to the embodiment of the present invention described above, on the other hand, heat is exchanged between the gas (hot gas) in the furnace body 1 and the heat transfer medium outside the furnace, so that the temperature of the hot gas in the furnace can be restrained from rising. According to the present embodiment of the invention, therefore, the cooling effect of the hot gas that serves as cooling means can be maintained for appropriate reflow soldering.

Figure 3:
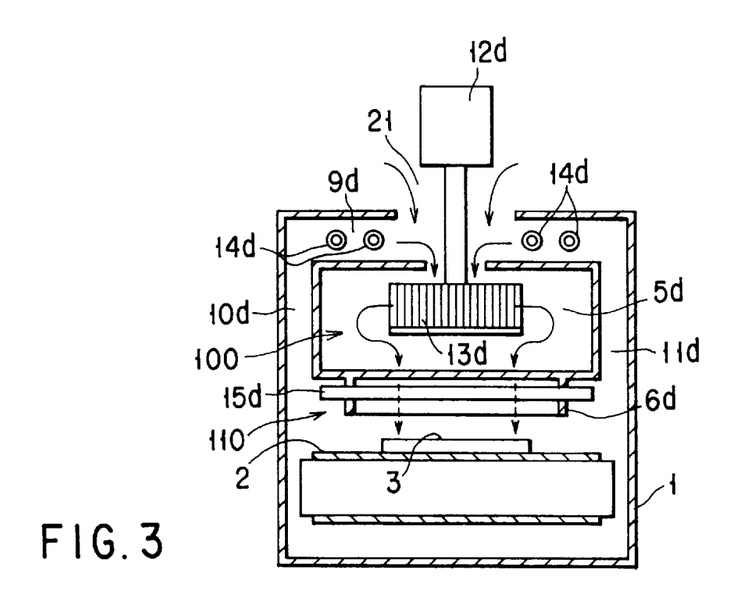
FIG. 3 is a sectional view corresponding to FIG. 2, showing a main heating zone of a reflow soldering furnace according to a second embodiment of the invention for carrying out the reflow soldering method of the invention.

FIG. 3 shows a second embodiment of the present invention. The basic construction and function of the second embodiment are the same as those of the first embodiment. Therefore, like reference numerals are used to designate common parts in the first and second embodiments, and a description of the constructions and functions of those parts is omitted. Thus, the following is a description of differences between these two embodiments. The second embodiment differs from the first embodiment in that the open air is introduced into the hot-gas circulation path. The second embodiment is applicable to a reflow soldering furnace that carries out reflow soldering in any other gas (e.g., air) than inert gases.

Since an inert gas atmosphere need not be maintained in the reflow soldering furnace that uses no inert gas, the furnace according to the present embodiment is provided with an open air inlet aperture 21 near a negative-pressure generating portion of the fan 13d, e.g., in the ceiling wall of the furnace body 1. The hot-gas applier 100 of this reflow soldering furnace is designed so that the temperature of the hot gas in the furnace is made lower than the target heating temperature by the low-temperature open air introduced through the open air inlet aperture 21. Heating of small-sized parts is restrained by means of the low-temperature hot gas from the hot-gas applier 100 as a to-be-heated object, such as a printed board 3, is heated to the target temperature by means of radiant heat from the radiant-heat applier 110 (e.g., halogen lamp heater 15d). Like the first embodiment, therefore, the second embodiment can achieve the object of the present invention.

Figure 4:
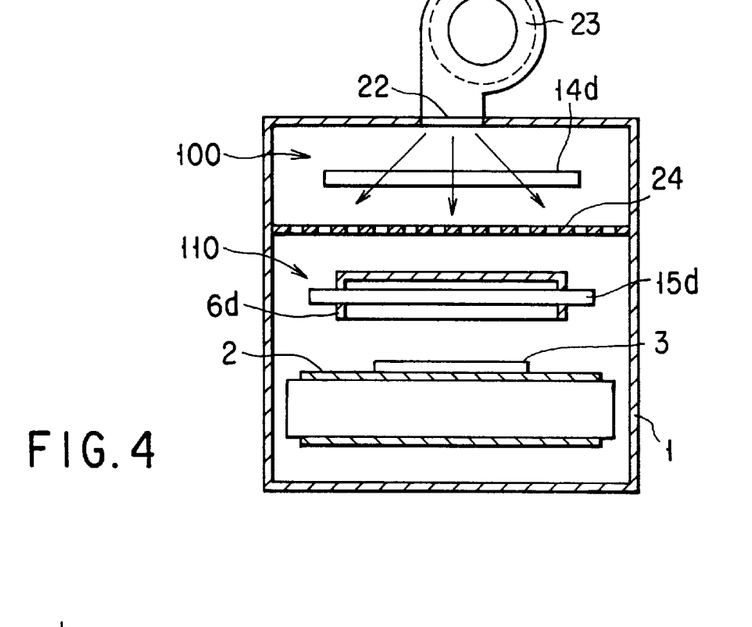
FIG. 4 is a sectional view corresponding to FIG. 2, showing a main heating zone of a reflow soldering furnace according to a third embodiment of the invention for carrying out the reflow soldering method of the invention.

FIG. 4 shows a third embodiment of the present invention. The basic construction and function of the third embodiment are the same as those of the first embodiment. Therefore, like reference numerals are used to designate common parts in the first and third embodiments, and a description of the constructions and functions of those parts is omitted. Thus, the following is a description of differences between these two embodiments. The third embodiment also differs from the first embodiment in that the open air is introduced into the hot-gas circulation path. The third embodiment is also applicable to a reflow soldering furnace that carries out reflow soldering in any other gas (e.g., air) than inert gases.

In the reflow soldering furnace according to the present embodiment, an open air blowing nozzle 22 is formed in the ceiling wall of the furnace body 1. A motor blower 23 is connected to the nozzle 22. The blower 23 is set on the ceiling wall of the furnace body 1. In the furnace body 1, a flow regulating plate 24 having a large number of vent holes is provided between a heat source 14d for gas heating and the halogen lamp heater 15d. The open air blown into the furnace body 1 by means of the blower 23 is heated into a hot blast by means of the heat source 14d. This hot blast is regulated as it passes through the regulating plate 24, and is blown against the underlying printed board 3. The hot-gas applier 100 of this reflow soldering furnace can lower the temperature of the hot blast by means of the open air introduced through the open air blowing nozzle 22. Also according to this third embodiment, heating of small-sized parts is restrained by means of the low-temperature hot gas from the hot-gas applier 100 as the to-be-heated object is heated to the target temperature by means of radiant heat from the radiant-heat applier 110, so that the object of the present invention can be achieved. The reflow soldering furnace according to the third embodiment has an advantage over the furnace according to the first embodiment in enjoying a wide temperature control range, although its thermal efficiency is lower.

Figure 6:
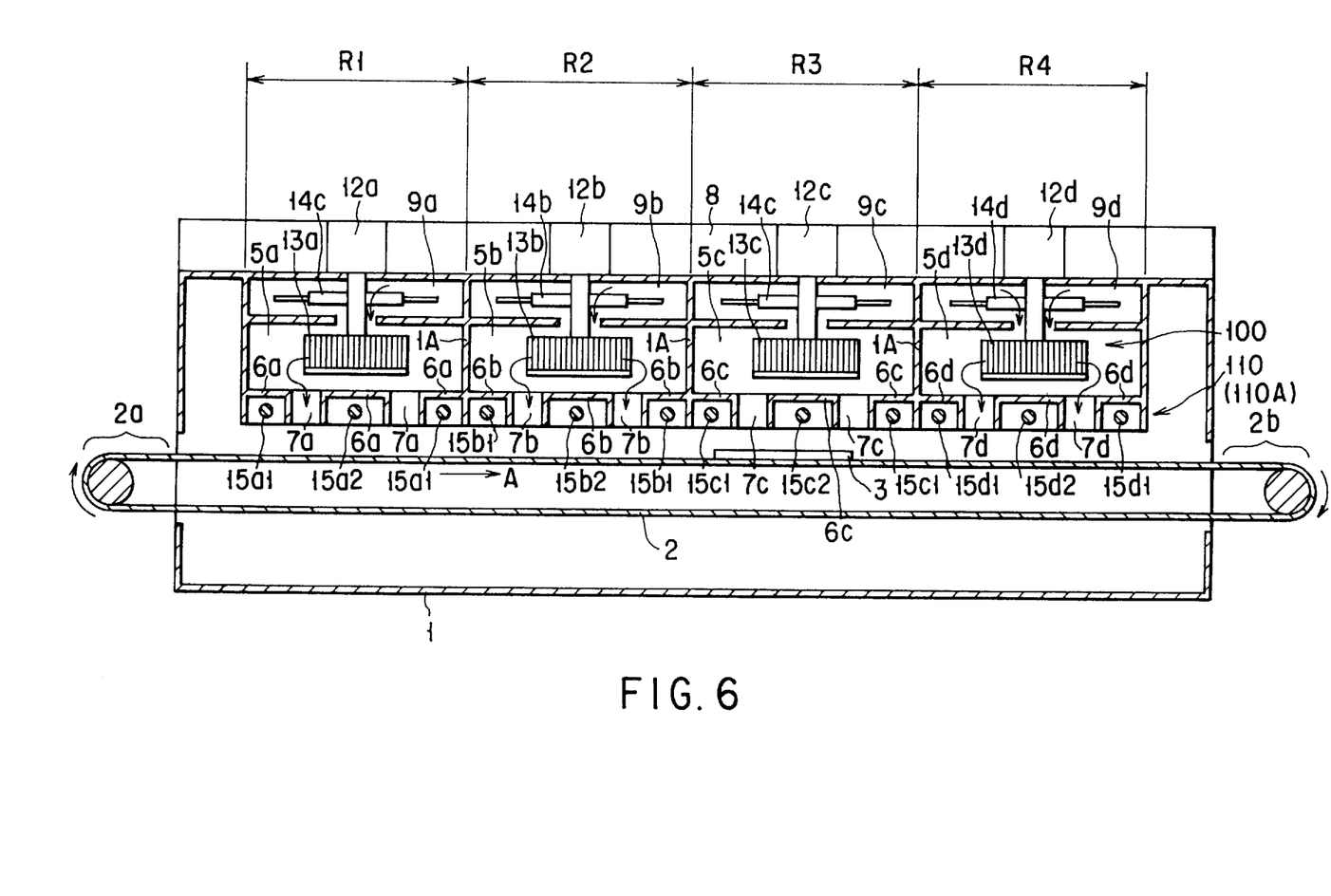
FIG. 6 is a sectional view schematically showing an outline of a reflow soldering furnace according to a fourth embodiment of the invention for carrying out the reflow soldering method of the invention.

FIG. 6 shows a fourth embodiment of the present invention. The basic construction and function of the fourth embodiment are the same as those of the first embodiment. Therefore, like reference numerals are used to designate common parts in the first and forth embodiments, and a description of the constructions and functions of those parts is omitted. Thus, the following is a description of differences between these two embodiments. The radiant-heat applier 110 according to the fourth embodiment is different from the one according to the first embodiment. The fourth embodiment is applicable to a reflow soldering furnace that carries out reflow soldering in an inert gas or any other gas atmosphere than inert gases.

According to this fourth embodiment, radiant-heat source mounting portions 6a to 6d in the preheating zones R1 to R3 and the main heating zone R4 are provided alternately with infrared heaters 15a1, 15b1, 15c1 and 15d1 (e.g., tungsten halogen heaters) for radiating infrared rays including near infrared rays and far infrared heaters 15a2, 15b2, 15c2 and 15d2 for radiating far infrared rays.

The hot-gas applier 100 has a function to blow off the hot gas of a temperature lower than the target temperatures in the zones R1 to R4. A radiant-heat applier 110A has a function to apply radiant heat of a temperature higher than the target temperatures to the to-be-heated object. Thus, the reflow soldering furnace according to the present embodiment can reduce temperature dispersions attributable to differences in heat capacity between the printed board and the electronic parts thereon. Further, the radiant-heat applier 110A of this embodiment can regulate input voltages for control circuits for the infrared heaters 15a1, 15b1, 15c1 and 15d1 and the far infrared heaters 15a2, 15b2, 15c2 and 15d2, thereby adjusting the ratio between the far infrared rays and the infrared rays including the near infrared rays. By doing this, the applier 110A can reduce temperature differences between the printed board and the electronic parts or between the parts with different heat capacities. According to this fourth embodiment, moreover, the to-be-heated object can be heated with infrared rays or far infrared rays only, depending on its type, by selecting the infrared heaters 15a1 to 15d1 or the far infrared heaters 15a2 to 15d2 by means of the control circuits.

The present invention is not limited to the embodiments described above. For example, the heating means according to the invention may be provided in some of heating zones or in preheating zones only. To achieve the object of the invention, conventional infrared heaters may be combined with by-pass ducts for cooling a hot gas. Any heaters that are designed to radiate radiant heat may be used as the radiant-heat applying means for applying radiant heat to the to-be-heated object.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reflow soldering furnace for reflow soldering a to-be-heated object on which both electric parts having high heat capacities and electric parts having low heat capacities are mounted, said reflow soldering furnace comprising:

a reflow soldering furnace body defined by furnace walls and including a preheating zone for heating the to-be-heated object to a first target temperature lower than a melting point of solder and a main heating zone for heating the to-be-heated object to a second target temperature at which solder melts;

a hot-gas applier for blowing a hot gas of a temperature lower than the first target temperature to the to-be-heated object in the preheating zone, thereby cooling the electric parts having the low heat capacities; and a radiant-heat applier for applying radiant heat of a temperature higher than the first target temperature to the to-be-heated object at least in the preheating zone, thereby heating the electric parts having high heat capacities.

2. A reflow soldering furnace according to claim 1, wherein said radiant heat applier comprises a heater for generating infrared rays including near infrared rays and a heater for generating far infrared rays.

3. A reflow soldering furnace according to claim 1, further comprising hot-gas circulating means for guiding the hot gas from the reflow soldering furnace body to outside of the furnace and then introducing the hot gas again into the reflow soldering furnace body, and a heat exchanger for exchanging heat between the hot gas guided to the outside of the furnace body and a heat transfer medium provided outside the furnace, thereby lowering the temperature of the hot gas.

4. A reflow soldering furnace according to claim 3, wherein said hot-gas circulating means comprises a by-pass duct diverging from the reflow soldering furnace body and serving to guide the hot gas to the outside of the furnace, said by-pass duct including a radiating wall for use as the heat exchanger.

5. A reflow soldering furnace according to claim 4, wherein said heat exchanger comprises heat dissipation accelerating means provided in the middle of the by-pass duct for accelerating the heat exchange between the hot gas and the heat transfer medium.

* * * * *